United States Patent [19]

Bae

[11] Patent Number: 5,710,053

[45] Date of Patent: Jan. 20, 1998

[54] METHOD FOR MANUFACTURING THIN FILM TRANSISTOR FOR A LIQUID CRYSTAL DISPLAY

[75] Inventor: Byung-seong Bae, Suwon, Rep. of Korea

[73] Assignee: Samsung Electronics Co., Ltd., Suwon, Rep. of Korea

[21] Appl. No.: 563,388

[22] Filed: Nov. 28, 1995

[30] Foreign Application Priority Data

Nov. 28, 1994 [KR] Rep. of Korea .................. 1994-31472

[51] Int. Cl.$^6$ .................................................. H01L 21/84
[52] U.S. Cl. ........................... 437/40; 437/46; 437/158
[58] Field of Search ........................... 437/21, 40, 46, 437/158; 148/DIG. 44

[56] References Cited

U.S. PATENT DOCUMENTS

| | | | |
|---|---|---|---|
| 5,053,345 | 10/1991 | Schnable et al. | 437/158 |
| 5,300,449 | 4/1994 | Okumura | 437/40 |
| 5,482,870 | 1/1996 | Inoue | 437/21 |
| 5,508,216 | 4/1996 | Inoue | 437/40 |

*Primary Examiner*—Chandra Chaudhari
*Attorney, Agent, or Firm*—Cushman Darby & Cushman, IP Group of Pillsbury Madison & Sutro LLP

[57] ABSTRACT

A method for manufacturing a thin-film transistor includes forming a silicon pattern on a substrate; forming a gate insulating film by a thermal oxidization process or a deposition process; forming a gate pattern by depositing a gate electrode and a gate line; implanting ions into the substrate; forming an interlayer-insulating film; activating the implanted ions; forming a gate contact hole and source-drain contact holes; and forming a wiring pattern. The resultant thin-film transistor increases reliability of devices and yield by reducing breakdown voltage between the gate line and the silicon pattern and improving characteristics of the insulation-destruction.

4 Claims, 8 Drawing Sheets

METHOD FOR MANUFACTURING THIN FILM TRANSISTOR FOR A LIQUID CRYSTAL DISPLAY

BACKGROUND OF THE INVENTION

The present invention relates in general to a thin film transistor used for a liquid crystal display and a method for manufacturing the same, and more particularly to a thin film transistor which exhibits significantly reduced leakage currents and enhanced gate breakdown characteristics, resulting in an increase of reliability of devices and yield and a method for manufacturing this type of thin film transistors.

DESCRIPTION OF THE PRIOR ART

Typical amorphous silicon thin film transistors have been used as switching means for turning on or off illumination of each pixel since the breakdown voltage is below 1 pA and on/off current ratio is above $10^6$, and they have been also widely used as switching means for liquid crystal displays because they are fabricated on a large-scale glass substrate, which is more economical than a quartz substrate, at a low temperature relatively easily.

Despite those various applications, the lower electron mobility of these transistors is an inappropriate characteristic for a high-speed driving circuit. Accordingly, in manufacturing liquid crystal display (LCD) driving circuits, single-crystal silicon elements are produced by additional processes and then bonded using a wire bonding method. Another proposed method is that tape-carrier package type transistors should be bonded using a hot press-bonding method to connect them to external signals.

The main disadvantage of these methods is that yield decreases as the number of pixels is increased and the pitch between the pixels is shortened, giving limitations to manufacturing an LCD having high resolution.

For these reasons, nowadays polysilicon TFTs have been more popularly used as switching elements for pixels because they have relative large electron mobility, enabling the LCD to have high resolution and high productivity.

There are two methods for manufacturing a polysilicon TFT: one is to use a quartz substrate at high temperature, another is to use a glass substrate at a low temperature.

A typical prior art polysilicon TFT used for an LCD is described below with reference to the accompanying drawings.

FIG. 1 is a schematic view of a typical prior art polysilicon TFT and FIG. 2 is a cross-sectional view taken along the line 2—2 of FIG. 1. FIG. 3 shows a patterned silicon under which partial polysilicon is lifted in response to oxidization of its own undersurface and the oxide thickness is severely reduced at the corner regions, and FIG. 4 shows a patterned silicon having horns of less oxidized silicon at the corners of the polysilicon.

The processing of the typical polysilicon TFT element is described in detail below with reference to FIGS. 1 and 2.

The process is begun by depositing silicon on a substrate using low-pressure chemical vapor deposition (LPCVD) method or any other method, crystallizing the deposited silicon using solid phase crystallization, or laser crystallization and then patterning the crystallized silicon to create a gate-insulating layer. In this process, thermal oxidation is used at elevated temperatures, while various CVD methods or a sputtering method are used at low temperatures.

Next, polysilicon is deposited to create a gate pattern and ion implantation is conducted to create a source-drain region. An insulating material is then deposited between the layers. After activating the implanted ion, a contact pattern is formed, on which a wiring metal is deposited at the next step.

The process is completed with forming a source-drain electrode and a wiring pattern.

However, there are some disadvantages that increased leakage currents and insulator breakdown characteristics are likely to occur at regions indicated by the respective circles in FIGS. 1 and 2, where the gate electrode and the silicon pattern cross and the oxide thickness is severely reduced.

Further, as shown in FIG. 3, a patterned silicon under partial polysilicon is lifted in response to oxidization of its own undersurface and the oxide thickness is severely reduced at the corner regions, and therefore insulator breakdown occurs easily in these thinned regions.

Another problem with the typical TFT fabrication process is shown in FIG. 4. The process illustrated in this figure forms horns at the regions of the patterned silicon, because of local oxidation inhibition. This oxidation inhibition is attributed to the difference of stress applied to each place. The major topological problems of these oxides are poor coverage of stepped surfaces.

SUMMARY OF THE INVENTION

In view of the above, it is an object of the present invention to provide a thin film transistor which exhibits significantly reduced leakage currents and enhanced gate breakdown characteristics, resulting in an increase of reliability of devices and yield, and a method for manufacturing this type of TFTs.

To achieve the above-mentioned object, the method for manufacturing this TFT is comprised of the formation of a silicon pattern by depositing silicon on a substrate (Step 10); the formation of a gate insulating film by a thermal oxidation process or deposition process (Step 20); the formation of a gate pattern by depositing a gate electrode- and a gate line-inducing material (Step 30); ion-implantation (Step 40); the formation of an interlayer-insulating film (Step 50); the activation of the implanted ion (Step 60); the formation of a gate contact hole and a source-drain contact hole (Step 70); and the formation of a wiring pattern (Step 80). In such a process sequence, somewhat unique techniques are that the gate electrode is deposited inside of the silicon pattern, and each gate contact hole is deposited on the gate electrode and the gate line after depositing the interlayer-insulating film and the resultant gate contact holes are interconnected during the formation process of the wiring pattern.

The structure of this TFT is comprised of a silicon pattern deposited on a substrate; a gate insulating layer deposited on the silicon pattern; a gate pattern including a gate electrode deposited on the gate-insulating layer and a gate line deposited on the substrate, isolated from the gate electrode; an interlayer-insulating film surrounding the gate pattern and the gate-insulating layer peripherally; a wiring pattern including a gate contact hole to allow electrical connection between the gate electrode and the gate line, and a source-drain contact hole to allow electrical connection between a source-drain electrode and the silicon pattern.

DETAILED DESCRIPTION OF THE PREFERRED EMBODIMENT

A preferred embodiment of the present invention is described below with reference to the accompanying drawings.

Figure 1:
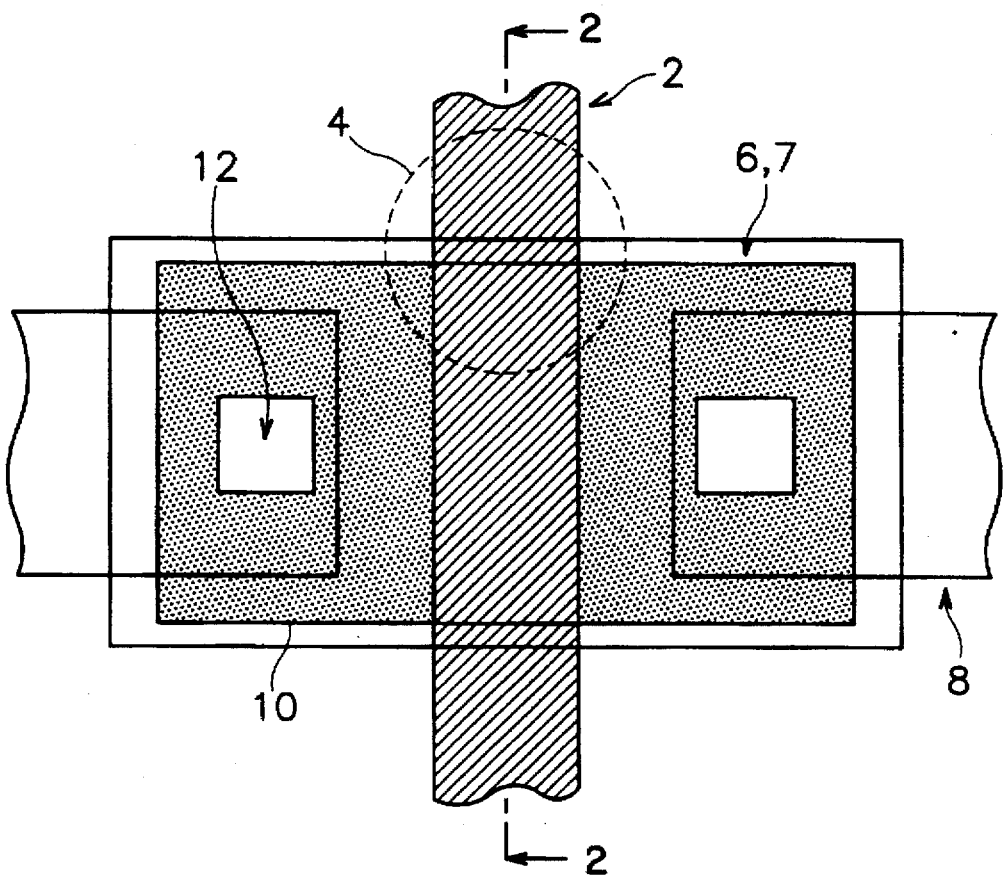
FIG. 1 is a plan view of a typical prior art liquid crystal display.
Figure 2:
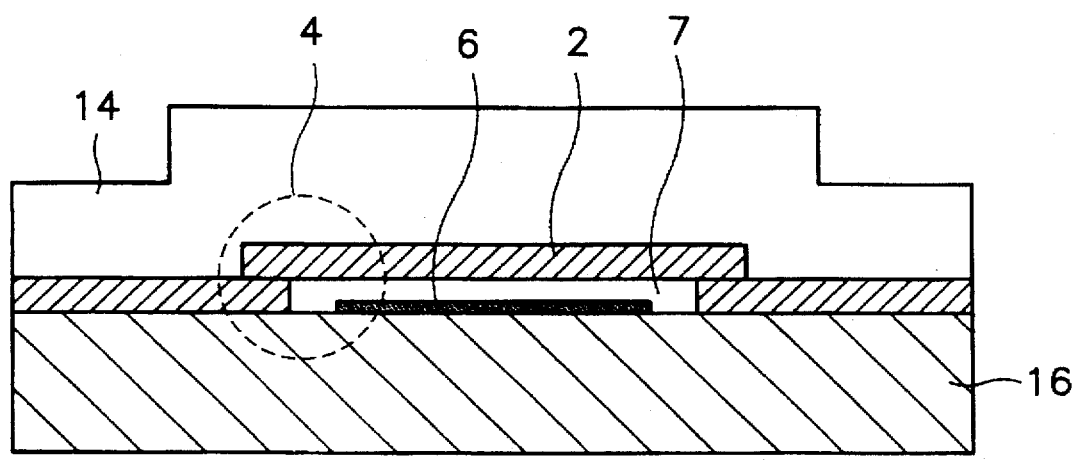
FIG. 2 is a cross-sectional view taken along the line 2—2 of FIG. 1.
Figure 3:
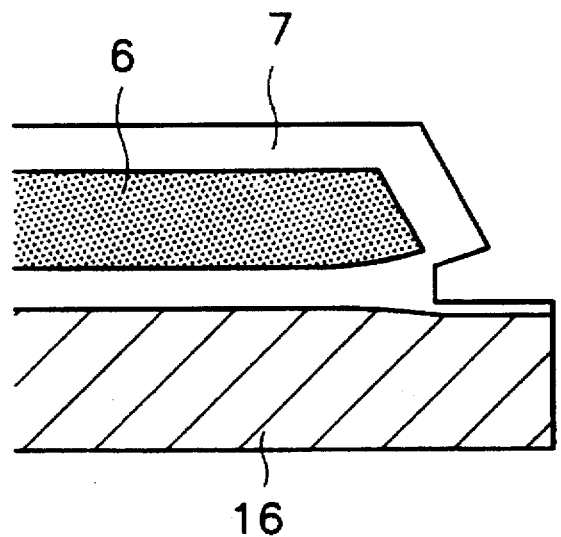
FIG. 3 is a cross-sectional view showing a result of oxidation according to the conventional technique.
Figure 4:
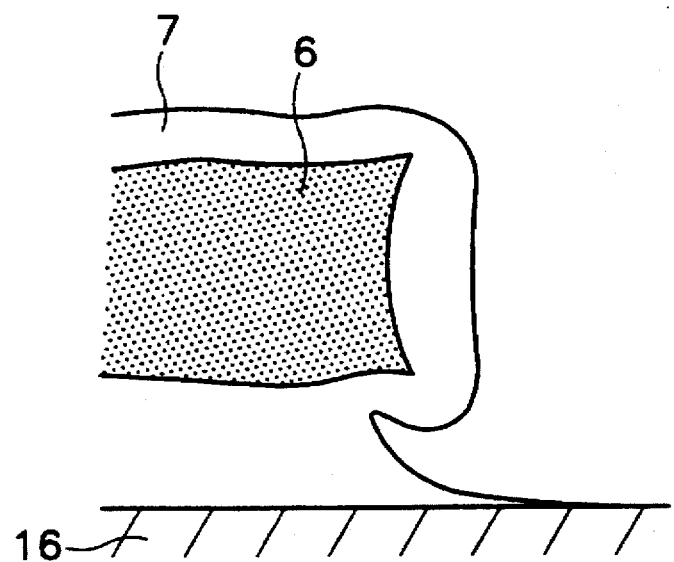
FIG. 4 is a cross-sectional view showing another result of oxidation according to the conventional technique.
Figure 5:
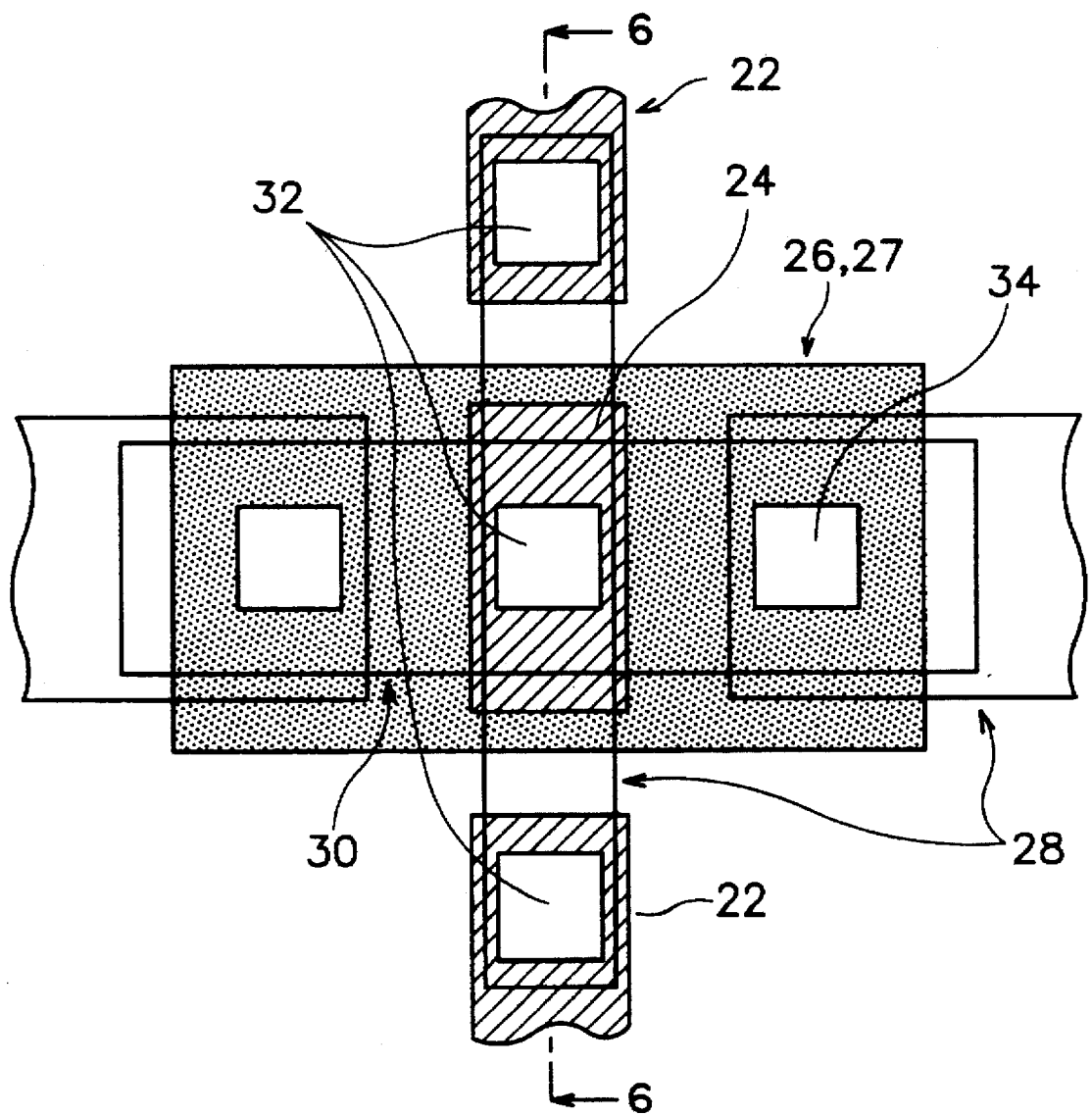
FIG. 5 is a schematic view of a preferred embodiment of a TFT of the present invention.
Figure 6:
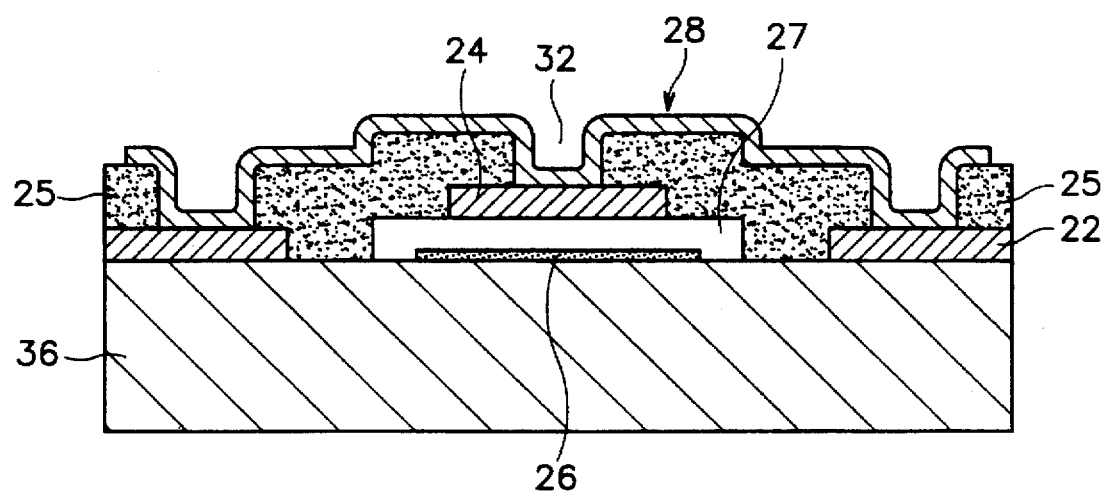
FIG. 6 is a cross-sectional view taken along the line 6—6 of FIG. 5.
Figure 7:
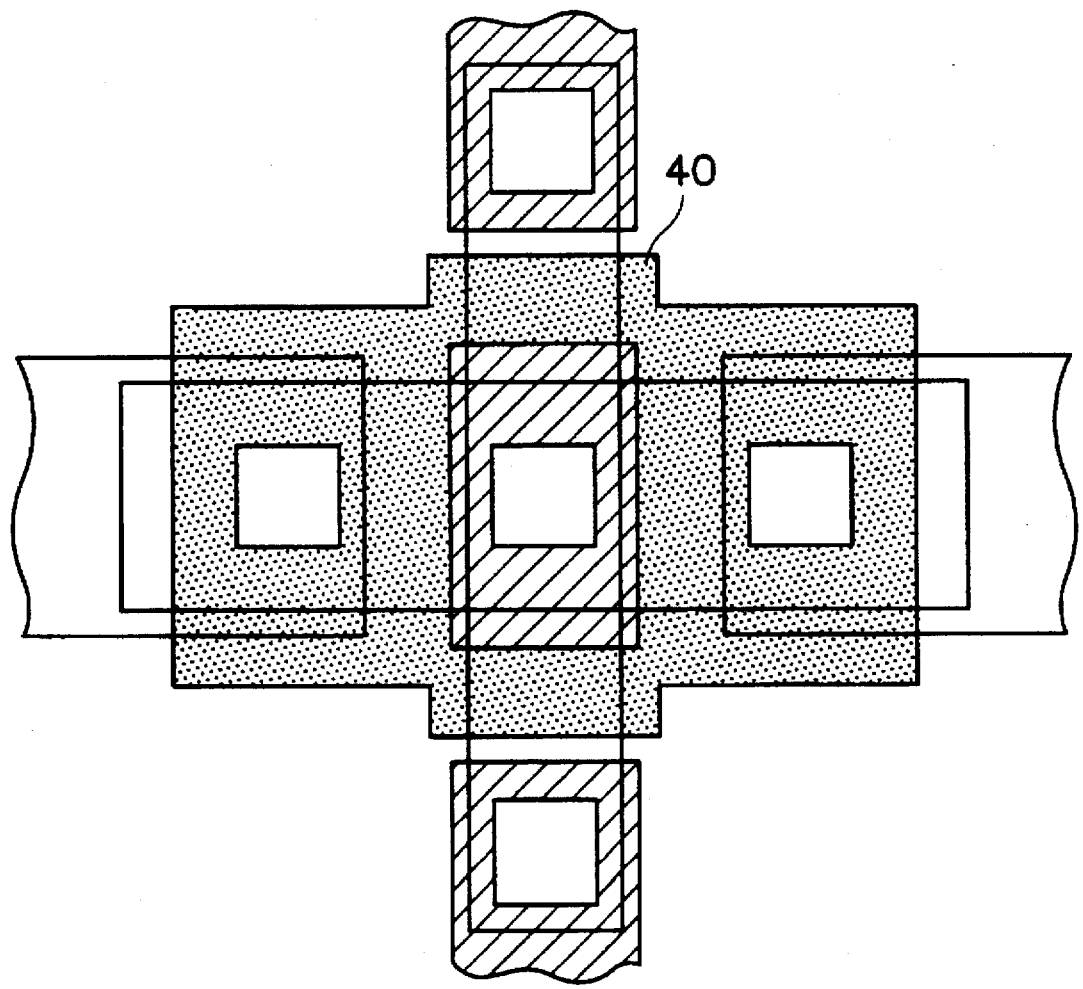
FIG. 7 is a schematic view of this TFT, forming the silicon to be projected along a gate wiring in the formation of the silicon pattern.

FIG. 5 is a schematic view of a preferred embodiment of a TFT of the present invention showing that a gate is formed somewhat inside of the silicon pattern; FIG. 6 is a cross-sectional view taken along the line 6—6 of FIG. 5; FIG. 7 is a schematic view of this TFT, forming the silicon to be projected along a gate wiring in the formation of the silicon pattern; and FIGS. 8A to 13B show the sequence of steps for fabricating this TFT.

As shown in FIGS. 8A–13B, the method for manufacturing this TFT is comprised of the formation of a silicon pattern 26 by depositing silicon on a substrate (Step 10); the formation of a gate insulating film 27 by a thermal oxidation process or deposition process (Step 20); the formation of a pate pattern by depositing a pate electrode 24 and a gate line 22 material (Step 30); ion-implantation (Step 40); the formation of an interlayer-insulating film 25 (Step 50); the activation of the implanted ion (Step 60); the formation of a gate contact hole 32 and a source-drain contact hole 34 (Step 70); and the formation of a wiring pattern 28 (Step 80). In such a process sequence, somewhat unique techniques are that the gate electrode 24 is deposited inside of the silicon pattern 26, and each gate contact hole 32 is deposited on the gate electrode 24 and the gate line 22 after depositing the interlayer-insulating film 25 and the resultant gate contact holes 32 are interconnected during the formation process of the wiring pattern 28.

The structure of this TFT is comprised of silicon pattern 26 deposited on a substrate; a gate insulating layer 27 deposited on the silicon pattern 26; a gate pattern including a gate electrode 24 deposited on the gate insulating layer 27 and a gate line 22 deposited on the substrate, isolated from the gate electrode 24; an interlayer-insulating film 25 surrounding the gate pattern and the gate insulating layer 27 peripherally; a wiring pattern 28 including a gate contact hole 32 to allow electrical connection between the gate electrode 24 and the gate line 22, and a source-drain contact hole 34 to allow electrical connection between a source-drain electrode and the silicon pattern 26.

The successive processes of manufacturing this TFT are described below with reference to FIGS. 8A to 8L.

Figure 8A:
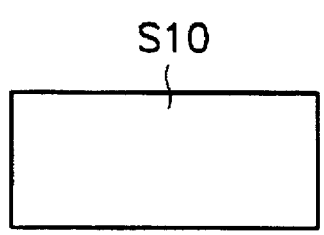
FIGS. 8A to 13B are schematic representations of successive fabrication stages, each shown in plan and in cross-section for fabricating this TFT.
Figure 8B:
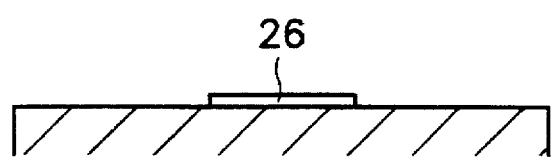
Figure 9A:
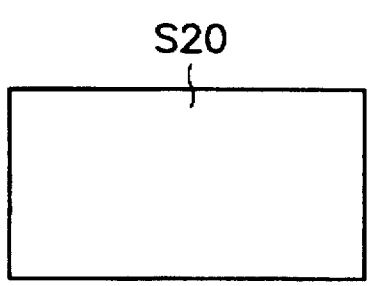
Figure 9B:
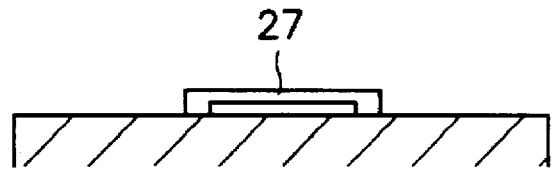

The process begins with the formation of the silicon pattern 26 on the substrate (step 10), as shown in FIGS. 8A and 8B. In this step, silicon is deposited so as to be projected toward the gate, thereby forming a stepped silicon 40 as illustrated in FIG. 7. This topology helps the predetermined area of the transistor to be maintained during ensuing process steps.

Next, as shown in FIG. 8B, a gate insulating layer 27 is deposited on the silicon pattern 26 (step 20).

Figure 10A:
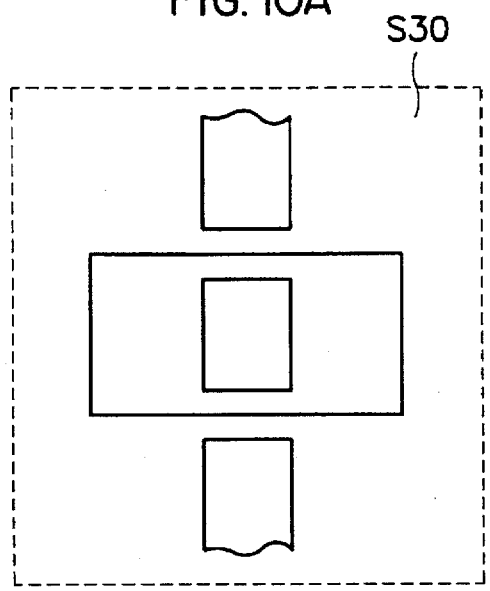
Figure 10B:
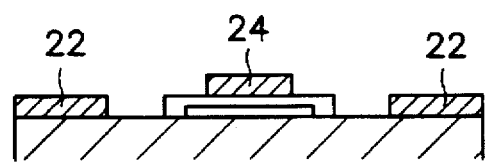

The gate-pattern is formed in such a way that the gate electrode 24 is deposited on the gate insulating layer 27 and the gate lines 22 are deposited at both sides of the silicon pattern 26 each having a distance from the silicon pattern 26 (step 30), as shown in FIGS. 10A and 10B. In this step, the gate electrode 24 is formed so as to be located somewhat inside of the edge of silicon pattern 26, so that no gate pattern is formed at the corner region of the silicon pattern 26, as shown in FIGS. 5 and 6.

Following the formation of the gate pattern, an ion implantation process is conducted (step 40). A mask for this process is provided to define the region where the ions will be implanted, and allows the ions to be implanted only up to the inside of the corner region of the silicon pattern 26, through the ion implantation window 30 of FIG. 5. More preferable topography can be attained when the ions are implanted inside of the gate pattern.

Figure 11A:
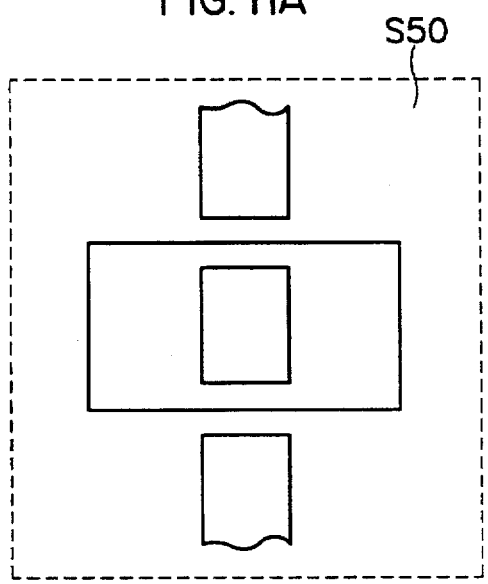
Figure 11B:
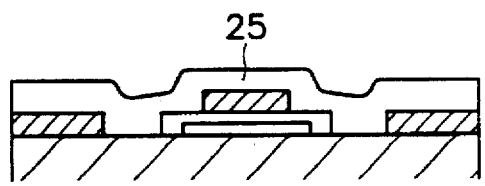

Then, an interlayer-insulating layer 25 is deposited as shown in FIGS. 11A and 11B (step 50).

The implanted ions are then activated (step 60).

Figure 12A:
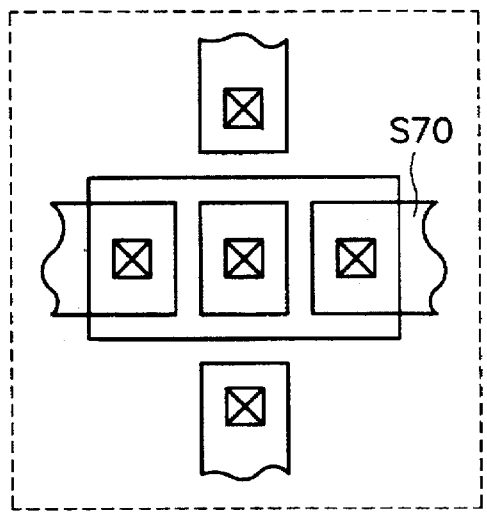
Figure 12B:
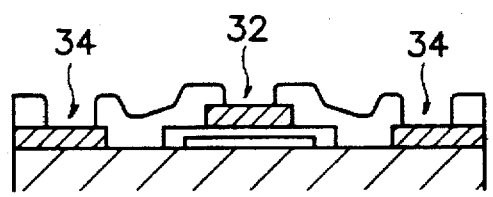

Next, as shown in FIGS. 12A and 12B, the gate contact hole 32 and the source-drain contact hole 34 are formed (step 80), where gate line and gate electrode and source-drain electrode will be formed, respectively.

Figure 13A:
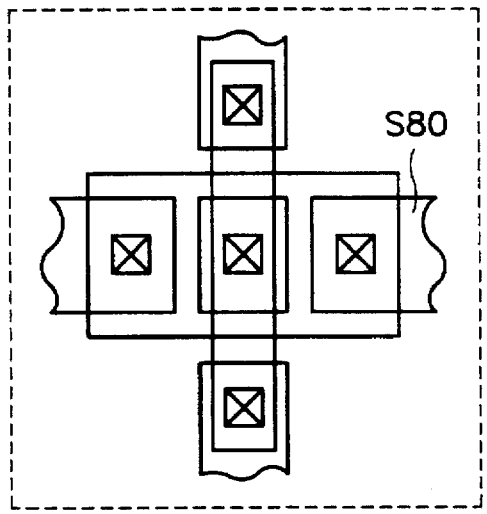
Figure 13B:
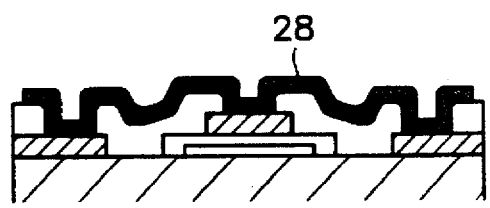

As a final step, the formation of the wiring pattern 28 is carried out as shown in FIGS 13A and 13B. The function of this pattern is to allow the source-drain electrode to be formed and connected with the gate electrode and the gate line as shown in FIGS. 5 and 6.

The main effects of the resulting TFT can be summarized as follows:

The thickness of the silicon pattern and gate pattern become thicker at the circled area of FIG. 6, as much as the interlayer-insulating film compared with that of the prior art TFT. This thickening effect can reduce breakdown. In addition, ion implantation is not applied at the edge of the silicon pattern, thereby increasing the resistance in that region.

As a result, this thin film transistor exhibits significantly reduced leakage currents and enhanced gate breakdown characteristics, resulting in an increase of reliability of devices and yield.

What is claimed is:

1. A method of fabricating a thin-film transistor, comprising the steps of:

forming a silicon pattern on a substrate, said pattern having a perimetrical edge;

forming a gate-insulating layer over the silicon pattern by one of a thermal oxidation process and a deposition process;

forming a gate pattern by depositing a gate electrode-inducing material on the gate-insulating layer at a region spaced within the perimeter of the silicon pattern, so as to avoid depositing gate electrode-inducing material out to the perimetrical edge of said silicon pattern, and forming a gate line-inducing material on the substrate;

implanting ions into the substrate;

forming an interlayer-insulating layer over the gate pattern on the substrate;

activating the implanted ions;

forming a gate contact hole through the interlayer-insulating layer, to the gate electrode-inducing material, and a source-drain contact hole through the interlayer-insulating layer, to the gate line-inducing material; and forming a wiring pattern on said interlayer-insulating layer, connecting said gate electrode-inducing material with said gate line-inducing material.

2. A method of fabricating a thin-film transistor of claim 1, in which:

the gate electrode-inducing material has upper and lower parts, and the silicon pattern includes stepped silicon surfaces which are projected near the upper and lower parts of the gate electrode.

3. A method of fabricating a thin-film transistor of claim 1, in which:

the gate-insulating layer is thicker than the interlayer-insulating layer.

4. A method of fabricating a thin-film transistor of claim 1, in which:

the ion implantation is performed mainly to the inside of the silicon pattern rather than beyond the perimetrical edge of the silicon pattern.

* * * * *